(12) United States Patent
Asscher et al.

(10) Patent No.: US 7,759,609 B2
(45) Date of Patent: Jul. 20, 2010

(54) METHOD FOR MANUFACTURING A PATTERNED STRUCTURE

(75) Inventors: Micha Asscher, Mevaseret Zion (IL); Gabriel Kerner, Innsbruck (AT)

(73) Assignee: Yissum Research Development Company of the Hebrew University of Jerusalem, Jerusalem (IL)

( * ) Notice: Subject to any disclaimer, the term of this patent is extended or adjusted under 35 U.S.C. 154(b) by 990 days.

(21) Appl. No.: 10/547,798

(22) PCT Filed: Mar. 4, 2004

(86) PCT No.: PCT/IL2004/000213

§ 371 (c)(1),
(2), (4) Date: Sep. 6, 2005

(87) PCT Pub. No.: WO2004/079450

PCT Pub. Date: Sep. 16, 2004

(65) Prior Publication Data

US 2006/0183309 A1    Aug. 17, 2006

Related U.S. Application Data

(60) Provisional application No. 60/452,042, filed on Mar. 6, 2003.

(51) Int. Cl.
*G03F 7/00* (2006.01)
*B82B 3/00* (2006.01)

(52) U.S. Cl. ................. 219/121.85; 430/322; 430/323; 430/324; 430/326; 427/256; 264/400

(58) Field of Classification Search ............ 219/121.65, 219/121.66; 359/291, 239, 714, 391; 438/487, 438/488; 216/40, 65; 430/1, 2, 945, 322, 430/323, 324, 326; 427/552, 555; 428/256
See application file for complete search history.

(56) References Cited

U.S. PATENT DOCUMENTS 3,779,779 A * 12/1973 Landsman ............... 430/271.1

(Continued)

FOREIGN PATENT DOCUMENTS

JP    358154285 A * 9/1983

OTHER PUBLICATIONS

Burgess, D. et al., "Calculations of the Surface Temperature Rise and Desorption Temperature in Laser-Induced Thermal Desorption", J. Vac. Sci. Technol. A, (1986), pp. 1362-1366, vol. 4, No. 3.

(Continued)

*Primary Examiner*—Samuel M Heinrich
(74) *Attorney, Agent, or Firm*—Browdy and Neimark, PLLC (57) ABSTRACT

A method for forming a micro- or nano-pattern of a material on a substrate is presented. The method utilizes a buffer layer assisted laser patterning (BLALP). A layered structure is formed on the substrate, this layered structure being in the form of spaced-apart regions of the substrate defined by the pattern to be formed, each region including a weakly physisorbed buffer layer and a layer of the material to be patterned on top of the buffer layer. A thermal process is then applied to the layered structure to remove the remaining buffer layer in said regions, and thus form a stable pattern of said material on the substrate resulting from the buffer layer assisted laser patterning. The method may utilize either positive or negative lithography. The patterning may be implemented using irradiation with a single uniform laser pulse via a standard mask used for optical lithography.

23 Claims, 9 Drawing Sheets

U.S. PATENT DOCUMENTS

| | | | | |
|---|---|---|---|---|
| 4,315,130 | A | * | 2/1982 | Inagaki et al. ............ 219/121.6 |
| 4,316,785 | A | * | 2/1982 | Suzuki et al. .......... 204/192.24 |
| 4,575,406 | A | * | 3/1986 | Slafer .................... 210/500.25 |
| 5,143,894 | A | * | 9/1992 | Rothschild et al. .......... 505/220 |
| 5,262,392 | A | * | 11/1993 | Hung et al. ................. 505/413 |
| 6,025,115 | A | * | 2/2000 | Komatsu et al. ............ 430/313 |
| 6,156,393 | A | * | 12/2000 | Polanyi et al. .............. 427/533 |
| 6,319,566 | B1 | * | 11/2001 | Polanyi et al. .............. 427/533 |
| 6,379,509 | B2 | * | 4/2002 | Choi et al. ............ 204/192.29 |
| 6,391,528 | B1 | * | 5/2002 | Moshrefzadeh et al. ..... 430/321 |
| 6,518,194 | B2 | * | 2/2003 | Winningham et al. ........ 438/717 |
| 6,521,541 | B2 | * | 2/2003 | Rossi ......................... 438/710 |
| 6,574,863 | B2 | * | 6/2003 | Tung et al. ..................... 29/846 |
| 6,602,790 | B2 | * | 8/2003 | Kian et al. ................... 438/690 |
| 6,696,363 | B2 | * | 2/2004 | Lee et al. ..................... 438/681 |
| 6,746,825 | B2 | * | 6/2004 | Nealey et al. ............... 430/315 |
| 6,803,175 | B2 | * | 10/2004 | Kobayashi .................. 430/322 |
| 6,878,417 | B2 | * | 4/2005 | Polanyi et al. .............. 427/533 |
| 6,946,410 | B2 | * | 9/2005 | French et al. ............... 438/800 |
| 7,033,476 | B2 | * | 4/2006 | Lee et al. .................... 204/603 |
| 7,090,783 | B1 | * | 8/2006 | Cui et al. ...................... 216/40 |
| 7,122,827 | B2 | * | 10/2006 | Alizadeh et al. ............... 257/17 |
| 7,172,912 | B2 | * | 2/2007 | Toyoda ......................... 438/30 |
| 7,176,114 | B2 | * | 2/2007 | Hill et al. .................... 438/553 |
| 7,232,686 | B2 | * | 6/2007 | Takayama et al. ........... 435/395 |
| 7,303,809 | B2 | * | 12/2007 | Choi et al. ................... 428/212 |
| 7,491,422 | B2 | * | 2/2009 | Zhang et al. ................. 427/256 |
| 7,507,519 | B2 | * | 3/2009 | Toyoda ........................ 430/198 |
| 7,524,408 | B2 | * | 4/2009 | Monbouquette et al. .... 204/486 |
| 7,531,120 | B2 | * | 5/2009 | Van Rijn et al. ............. 264/299 |
| 2002/0171815 | A1 | * | 11/2002 | Matsuyama et al. ........... 355/55 |
| 2004/0235199 | A1 | * | 11/2004 | Jung et al. ...................... 438/1 |
| 2006/0003262 | A1 | * | 1/2006 | Yang et al. .................. 430/311 |
| 2006/0057502 | A1 | * | 3/2006 | Okada et al. ................ 430/313 |

OTHER PUBLICATIONS

Chin, G. (editor). "Laser Patterning Lightly", Editor's Choice, Science, May 7, 2004, pp. 797, vol. 304.

Gomer, R., "Diffusion of Adsorbates on Metal Surfaces", Rep. Prog. Phys., (1990), pp. 917-1002, vol. 53.

Huang, L. et al., "Buffer-Layer-Assisted Growth of Nanocrystals: AG-Xe-Si(111)", Phys. Rev. Lett., May 4, 1998, pp. 4095-4098, vol. 80, No. 18.

Kerner, G. et al., "Adsorption Desorption and Diffusion of Potassium on Metal and Oxide Surfaces", in *NATO Advanced Research Workshop on Collective Diffusion on Surfaces: Correlation Effects and Adatom Interactions*, M. Tringides and Z. Chevoj eds., Kluwer Academic Publishers, Dordrecht, The Netherlands, (2000), pp. 129-141.

Kerner, G. et al., "Buffer Layer Assisted Laser Patterning of Metals on Surfaces", Nanoletters, (Jul. 6, 2004), pp. 1-22, (3).

Kerner, G. et al., "Laser Patterning of Metallic Films via Buffer Layer", Surface Sciences, (2004), pp. 5-12, vol. 557.

Rosenzweig, Z. et al., "Laser Induced Thermal Desorption: A Time Resolved Study", J. Chem. Phys., Mar. 1, 1992, pp. 4040-4043, vol. 96, No. 5.

Schlichting, H. et al., "Techniques for Attainment, Control and Calibration of Cryogenic Temperatures at Small Single-Crystal Samples Under Ultrahigh Vacuum", Rev. Sci. Instrum., Jul. 1993, pp. 2013-2022, vol. 64, No. 7.

Tom, H. W. K. et al., "Studies of Alkali Adsorption on Rh(111) Using Optical Second-Harmonic Generation", Surf. Sci., (1986), pp. 466-476, vol. 172.

Verhoef, R. et al., "Repulsive Interactions of Potassium on Re(001)", J. Chem. Phys., Jun. 8, 1997, pp. 9353-9361, vol. 106, No. 22.

Weaver, J. H. et al., "Cluster Assembly of Interfaces: Nanoscale Engineering", Science, Mar. 22, 1991, pp. 1443-1451, vol. 251.

Williams, P. A. et al., "Physisorbed Template for Spatial Patterning of Adsorbates", Phys. Rev. Lett., Nov. 3, 1997, pp. 3459-3462, vol. 79, No. 18, XP-002286779.

Wilson, Mark, "Bending Nature's Rules to Pattern Nanostructures on Sticky Surfaces", Jun. 2004, Physics Today.

Xiao, X. D., et al., "Surface Diffusion Probed by Linear Optical Diffraction", Surf. Sci., (1992), pp. 295-298, vol. 271.

Zhao, W. et al., "Coverage Grating Template for the Study of Surface Diffusion: K Coadsorbed with CO on Re(001)", Surf. Sci., (1999), pp. 1-13, vol. 429, XP-002286781.

Zhao, W. et al., "Diffusion of Potassium on Re(001) Investigared by Coverage Grating-Optical Second-Harmonic Diffraction", J. Chem. Phys., Oct. 8, 1997, pp. 5554-5560, vol. 107, No. 14, XP-008032363.

Zhao, W. et al., "Interaction and Diffusion of Potassium on $Cr_2O_3(0001)/Cr(110)$", Phys. Rev. B, Sep. 15, 2000, pp. 7527-7534, vol. 62, No. 11.

Zhu, X. D. et al., "Surface Diffusion of CO on Ni(111) Studied by Diffraction of Optical Second-Harmonic Generation off a Monolayer Grating", Phys. Res. Lett., Dec. 19, 1988, pp. 2883-2885, vol. 61, No. 25.

* cited by examiner

○ BUFFER
● METAL

"POSITIVE" LASER LITHOGRAPHY

○ BUFFER
● METAL

"NEGATIVE" LASER LITHOGRAPHY

METHOD FOR MANUFACTURING A PATTERNED STRUCTURE

FIELD OF THE INVENTION

This invention relates to a method and system for creating a pattern at the nanometer scale.

LIST OF REFERENCES

The following references are considered to be pertinent for the purpose of understanding the background of the present invention:
1. Zhu, X. D., Rasing, Th. and Shen, Y. R., "Surface Diffusion of CO on Ni(111) Studied by Diffraction of Optical Second Harmonic Generation off a Monolayer Grating", Phys. Rev. Lett., 61, 2883 (1988).
2. Xiao X. D., Xie Y. and Shen, Y. R., "Surface Diffusion Probed by Linear Optical Diffraction", Surf. Sci., 271, 295 (1992).
3. Gomer, R, "Surface Diffusion", Rep. Prog. Phys., 53, 917 (1990).
4. Burgess, D. Jr., Stair, P. C. and Weitz, E., "Calculations of the Surface Temperature Rise and Desorption Temperature in Laser-Induced Thermal Desorption", J. Vac. Sci. Technol., A4(3), 1362 (1986).
5. Rosenzweig Z. and Asscher M., "Laser Induced Desorption: A Time Resolved Study", J. Chem. Phys., 96(5), 4040 (1992).
6. Weaver, J. H. and Waddill, G. D., "Cluster Assembly of Interfaces: Nanoscale Engineering", Science, 251, 1444 (1991).
7. Huang, L. Chey, S. J. and Weaver J. H., "Buffer Layer Assisted Growth of Nanocrystals: Ag—Xe—Si(111)", Phys. Rev. lett. 80, 4095 (1998).
8. Schlichting, H. and Menzel, D., "Techniques for Attainment, Control and Calibration of Cryogenic Temperatures (5 K and up) at Small Single Crystal Samples Under Ultrahigh Vacuum", Rev. Sci. Instrum. 64 (7), 2013 (1993).
9. Zhao W., Kerner G., Asscher M., Wilde M., Al-Shamry K., Freund H.-J., Staemmler V., Wieszbowska M., "Diffusion of Potassium on $Cr_2O_3(0001)/Cr(110)$ Studied by Coverage Grating—Optical Second Harmonic Diffraction", Phys. Rev. B, 62 (11), 7527 (2000).
10. Kerner G., Danziger I. M., Zhao W. and Asscher M. Adsorption, "Desorption and Diffusion of potassium on metal and oxide surfaces, in *NATO Advanced Research Workshop on "Collective Surface Diffusion Coefficients Under Non-Equilibrium Conditions"* ", M. Tringides and Z. Chevoj eds., Kluwer Academic Publishers, Dordrecht, 2000.
11. Verhoef R. W., Zhao W. and Asscher M., "Repulsive interactions of potassium on Re(001).", J. Chem. Phys., 106(22), 9353 (1997).
12. Zhao W., Verhoef R. W. and Asscher M., "Diffusion of K on Re(001)", J. Chem. Phys., 107, 5554 (1997).
13.13. Tom H. W. K., Mate C. M., Zhu X. D., Crowell J. E., Shen Y. R. and Somorjai G. A., "Studies of Alkali Adsorption on Rh(111) using optical second harmonic generation.", Surf. Sci., 172, 466 (1986).
14. Zhao W. and Asscher M., "Coverage Grating Template for the Study of Surface Diffusion: K Coadsorbed with CO on Re(001).", Surf. Sci., 429, 1-13 (1999).
15. P. A. Williams, G. A. Reider, L. P. Li, U. Höfer, T. Suzuki, T. F. Heinz, "Physisorbed Template for Spatial Patterning of Adsorbates", Phys. Rev. Lett 79, 3459 (1997).

BACKGROUND OF THE INVENTION

Spatial patterning of thin films on surfaces is of great importance for basic physical sciences and technology. In order to reach ever faster and more complex performance of computing machines, nanometer size conducting wires and complex structures patterned over semiconductor, oxide and metallic substrates are currently at the forefront of modern technological efforts. However, basic scientific issues, such as diffusion of adsorbates on surfaces [1-3], film growth mechanisms and submicron metallic electrodes for conductivity measurements, often rely on spatial patterning of thin films.

Periodic patterning of adsorbate coverage [1, 2] has been demonstrated by means of Laser Induced Thermal Desorption (LITD) [4, 5]. This method, while being applicable for weakly bound adsorbates, may lead to surface damage in the case of strongly bound species.

Metal deposition on surfaces assisted by a homogeneous xenon buffer layer has been developed utilizing the Buffer Layer Assisted Growth (BLAG) procedure [6, 7]. It was demonstrated to be a very efficient way to grow well-defined metallic clusters on semiconductor surfaces.

SUMMARY OF THE INVENTION

There is a need in modern technology to facilitate spatial patterning of metallic (or any other strongly interacting species) adsorbates on surfaces, by providing a novel patterning technique. The technique of the present invention provides for obtaining a micro- or nanometer size pattern in a structure, by employing a buffer layer assisted laser patterning. By using the technique of the present invention, metallic thin films can be patterned by laser desorption of weakly bound buffer layers on surfaces.

According to one broad aspect of the present invention, there is provided a method for forming a micro- or nano-pattern of a material on a substrate, the method comprising: utilizing pulsed laser irradiation to create a pattern on top of a substrate, the pattern being in the form of spaced-apart regions each including a weakly physisorbed buffer layer with said material on top thereof; and applying a thermal process to remove the remaining buffer layer within said regions, and thus form a stable pattern of said material on the substrate resulting from a buffer layer assisted laser patterning.

The patterning technique of the present invention utilizes either positive or negative lithography. This may be carried out using a single laser pulse split into two light components interfering on the structure.

The technique of the present invention may utilize irradiation of the buffer layer with a single uniform laser pulse via a mask designed in accordance with the pattern to be formed.

Thus, according to one embodiment of the invention (positive lithography), the wealdy physisorbed buffer material layer is deposited on the substrate, and the layer of the material to be patterned is deposited onto the buffer layer. A material removal is applied to the so-obtained layered structure in selected regions thereof (defined by the pattern to be obtained). Then the buffer layer, carrying the patterned material on top, is removed by thermal annealing (constituting said thermal process), thus enabling soft landing and final thermally stable pattern on the substrate.

The above is performed in vacuum conditions at cryogenic temperatures. Preferably, the material removal in the selected regions of the layered structure is achieved by irradiating the structure with electromagnetic radiation (laser beam) at a predetermined wavelength range in a manner to form a certain interference pattern on said structure corresponding to the pattern to be obtained. Preferably, the structure is irradiated by a single laser pulse, which is split into two beams which recombine on the substrate's surface thereby providing said interference pattern. By varying an angle of incidence of said radiation, the period of the pattern can be adjusted.

According to another embodiment of the invention (negative lithography), the buffer material layer is deposited on top of the substrate; and a pattern is created on the clean buffer layer at low temperature. Then said material (to be patterned) is deposited on top of the so-obtained structure (i.e., patterned buffer layer on the substrate), such that a fraction of the material directly and strongly attaches to the substrate. The buffer layer with the extra material on top thereof is then removed by the thermal process consisting of application of a second uniform laser pulse.

According to yet another embodiment of the invention, the laser-patterning is implemented using a single, uniform laser beam forming a pattern through a mask (similar to standard photo-lithography). This enables generation of complex structures, while allowing for varying the laser power in order to control the line widths.

Preferably, the substrate is selected from semiconductor, an oxide thereof or metal. The buffer material may include, for example, noble gases (Xe, Kr), hydrocarbons, $CO_2$, water or $N_2O$. The material to be patterned may be a metal, for example alkali metal, copper, silver or gold or metal-oxides.

The utilization of the technique of the single pulse-laser desorption of inert buffer material provides for macroscopic patterning of elements that are nanometer wide. This is potentially a much faster and thus more efficient process compared with the currently used optical lithography, based on wet chemistry. Moreover, using inert materials, the process will be safer and environment conserving, which is a concern for everyone for future industrial processes.

The technique of the present invention can advantageously be used in micro(nano) electronics due to the following features. The technique is a totally hazardous materials free process, fully vacuum based and therefore environmentally friendly. This is contrary to the current procedures at the microelectronics industry, which involve many rather problematic materials from the environment point of view. The technique of the present invention provides for operating with a single low power, 10 nsec duration laser pulse to generate a macroscopic area (millimeters in range) of nanometer size patterns, whose widths can readily be controlled by variation of the laser power. As a result the complex, multiple steps patterning process via photo-lithography currently dominating in the industry can be eliminated. The use of standard masks together with the method of the present invention provides for producing complex nanometer patterns. The use of different types of buffer layers that are more strongly bound (e.g. water) enables the operation at liquid nitrogen temperatures which is economically favorable temperature range. The pattern structures produced by the technique of the present invention can be used as macroscopically long nano-electrodes for modern nano-science studies such as conductivity of polymers, DNA, etc. In addition, variable size conducting wires as the basis for sensors in biological studies and in particular applications in the micro (nano) electronics industry are the major potential areas of science and technology that are expected to benefit from the present invention.

The technique of the present invention provides for patterning thin conducting films to wires at widths in the nanometer scale (potentially less than 30 nm), way below current technological limit, using a single laser pulse, i.e., via a parallel process. This can be achieved if the patterning laser is operating in the UV wavelength range and using higher interfering laser beams angle of incident, up to a practical maximum angle (45 to 60 degrees with respect to the normal to the surface). Buffer layers that can be operated at liquid nitrogen temperatures (100K), e.g. gaseous hydrocarbons, $CO_2$, water, $N_2O$ and more, can also be used. By utilizing standard optical lithography masks together with the technique of the present invention complex structures (two-dimensional patterns) can be produced that are needed in typical micro(nano)electronics VLSI methodology.

According to another aspect of the invention, there is provided a method for forming a micro- or nano-pattern of a material on a substrate, the method comprising:

forming a layer structure on the substrate by depositing a weakly physisorbed buffer layer on the substrate and depositing a layer of the material to be patterned onto the buffer layer;

splitting a single laser pulse of a predetermined wavelength range into two beams and directing said beams onto said layered structure such that the beams recombine on said layered structure thereby forming a certain interference pattern on said structure corresponding to the micro- or nano-pattern to be obtained, thereby removing the structure materials in selected regions of the structure defined by the interference pattern;

and subsequently removing the buffer layer between the patterned material and the substrate by thermal annealing at room temperature.

According to yet another aspect of the invention, there is provided a method for forming a micro- or nano-pattern of a certain material on a substrate, the method comprising:

applying a first laser pulse to a substrate coated by a weakly physisorbed buffer layer, to form a pattern in the form of spaced-apart regions of the buffer layer on the substrate;

depositing said certain material on top of said buffer layer and on the substrate within the spaces between the buffer regions thus forming a direct contact of the deposited material with the substrate; subsequently applying a second laser pulse to remove the buffer layer and the deposited material on top of the buffer layer, thereby allowing said material to form very smooth and even narrower patterns on the substrate.

According to yet another aspect of the present invention, there is provided a method for controlling a process of formation of a sample having a micro- or nano-pattern of a certain material on a substrate, the method comprising:

generating a pulsed laser radiation to be used for patterning the sample;

while directing the laser pulse towards the sample, spatially separating said pulse into a first relatively large portion and a second relatively small portion and allowing propagation of the first portion along a first processing channel for the patterning of the sample and directing the second portion along a second monitoring channel, the first portion wile propagating along the first channel being split into two light components to interfere on the sample and thereby create the pattern, the second portion being directed onto the patterned sample to enable detection of light scattered and diffracted from the periodic pattern;

the method thereby enabling the patterning and controlling of the patterning process using the same pulse of the laser radiation.

Preferably, the method also comprises separating, from said second portion, a third light portion and directing it to a detector to thereby enable monitoring the laser power and its stability.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

The technique of the present invention provides for Buffer Layer Assisted Laser Patterning (BLALP) of thin films to form micro- or nanofeatures (wires) of the pattern.

Figure 1A:
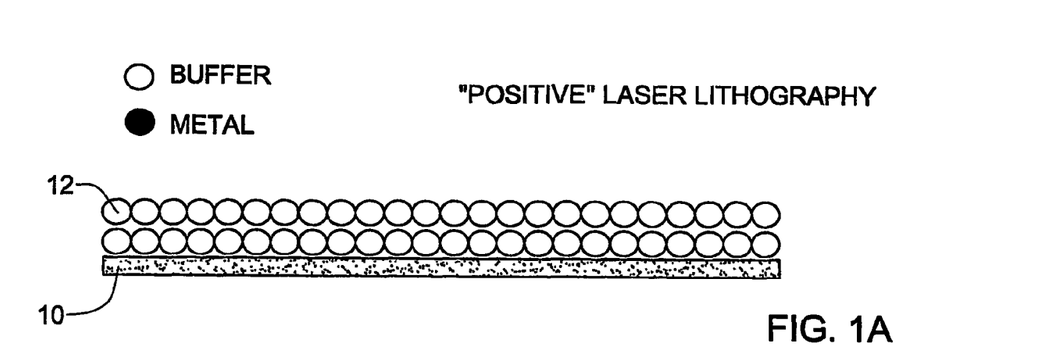
FIG. 1A-1D schematically illustrate the main steps of a buffer layer assisted laser patterning (BLALP) procedure according to one embodiment of the present invention, the so-called "positive" BLALP.
Figure 1B:
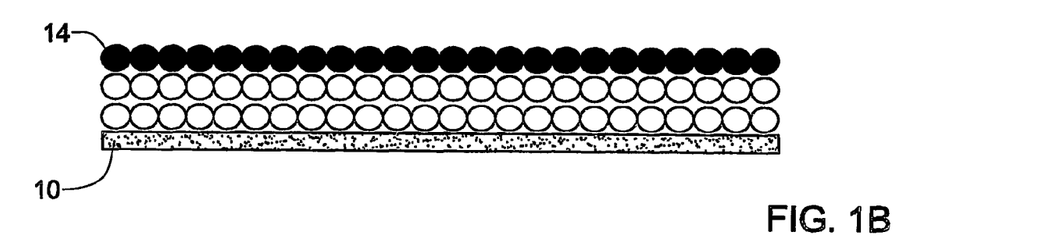

Referring to FIGS. 1A-1B, there is schematically illustrated the main steps of a BLALP method according to one embodiment of the invention. In this embodiment, "positive" BLALP is used, consisting in depositing a buffer layer on top of substrate; depositing a metallic layer on top of the buffer layer; creating a pattern on the substrate by heating the substrate with laser radiation within selective regions to remove buffer and metallic material within these regions; and totally removing the remaining buffer material by slow thermal annealing (at room temperature).

As shown in FIG. 1A, initially a structure in the form of a stack of buffer and metallic layer on top of a substrate is prepared: A cold substrate 10 (made of a semiconductor, an oxide, or metallic material) is provided (e.g., prepared under UHV conditions); and a multilayer structure of a weakly bound and chemically inert (physisorbed) buffer material 12, such as Xe, is deposited on top of the substrate. Generally, the buffer material is selected from noble gases, gaseous hydrocarbons, $CO_2$, water, $N_2O$. Then, a thin film 14 of a metallic material that is to be patterned is grown at an appropriate thickness on top of the buffer material 12 (FIG. 1B). The metallic material may include alkali metals (for demonstration purposes), but mostly noble metals selected from copper, silver or gold, or it may be an oxide film.

Figure 1C:
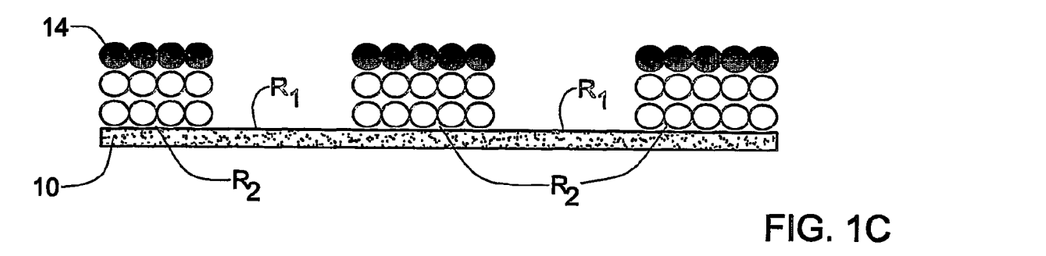

Subsequently, an LITD (laser induced thermal desorption) coverage grating is prepared, in which the buffer material 12 and the metallic material 14 are removed from periodic spaced-apart regions $R_1$ of the substrate 10 (defined by a predetermined pattern to be obtained) leaving periodic spaced-apart regions $R_2$ with the buffer material layer 12 and the metallic material 14 on top thereof (FIG. 1C). This is implemented by fast (10 nsec) heating of the substrate within the regions $R_1$. Preferably, such a selective heating of the substrate is achieved in a single laser pulse at the constructive interference troughs of the laser grating. More specifically, by splitting a single laser pulse into two beams that recombine, spatially overlapping on the surface. Consequently, interference pattern that is generated leads to LITD of the buffer layer with the metallic film on top along the constructive stripes. The width of the remaining stripes of metallic wires on top of the buffer can be controlled and varied by changing the laser power density, while spacing between the wires, the period ($\omega$) is determined by the laser wavelength ($\lambda$) and the angle of incidence of the two beams ($\theta$), according to the Bragg equation: $\omega = \lambda/2 \sin \theta$.

Figure 1D:
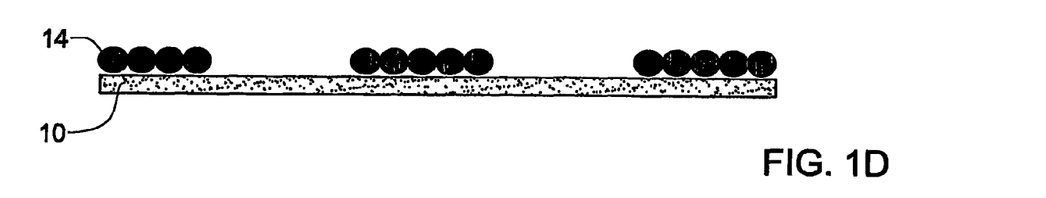

Then, the remaining buffer material 12 is totally removed by slow thermal annealing, while the remaining adsorbate 14 gradually migrates ("soft-landing") to the substrate surface retaining the pattern created on the buffer material (FIG. 1D).

Figure 2:
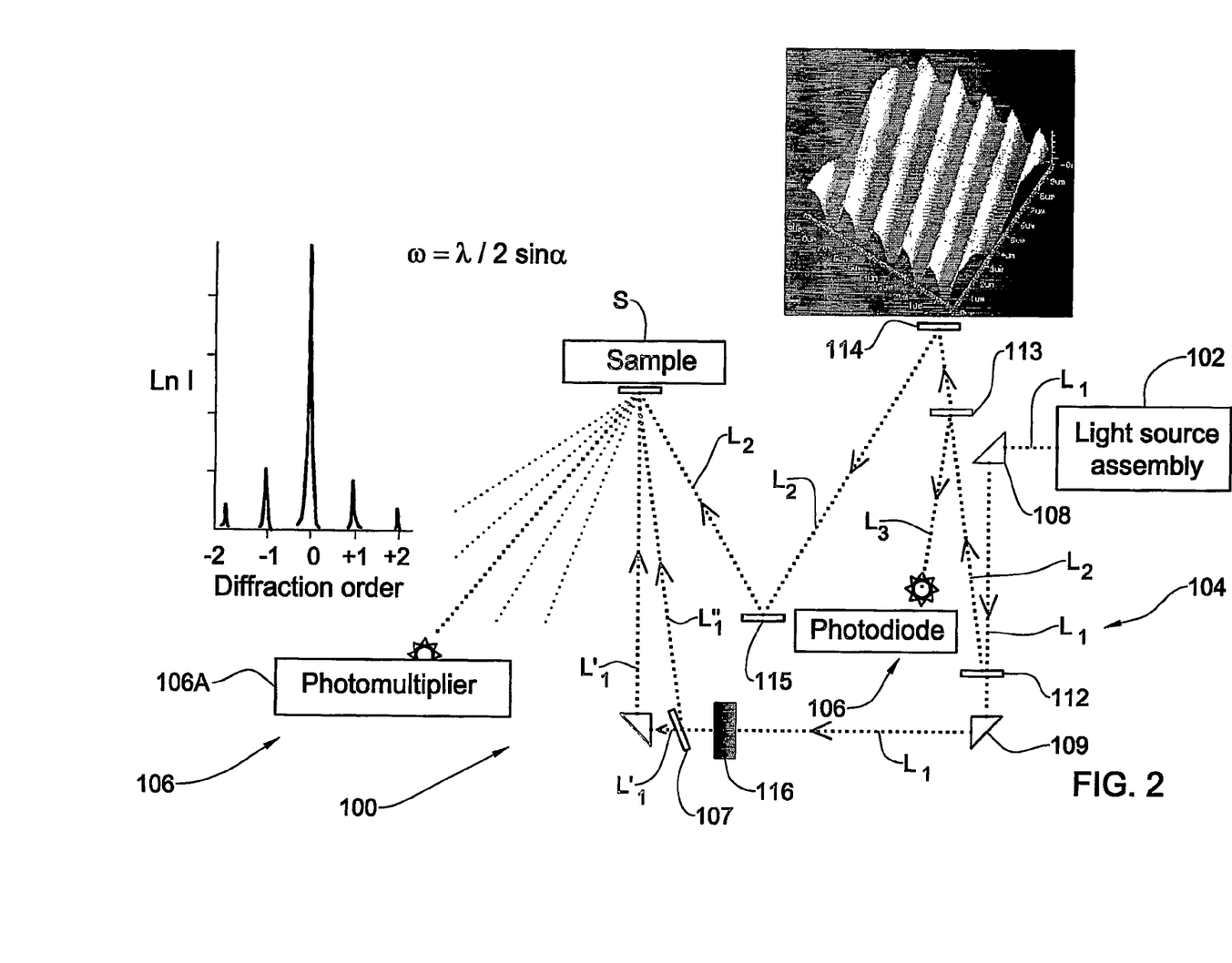
FIG. 2 schematically illustrates an optical system configured for carrying out the BLALP of the present invention, and for concurrent monitoring of the process.

In the experiments for the purposes of the present invention, a generally known experimental set-up was used. This set-up is schematically illustrated in FIG. 2. The inventors have found that using the same laser pulse provides for formation of periodic patterns on a sample, in-situ detection of the pattern being produced, and also monitoring the laser intensity as a measure of stability. The set-up 100 includes a light source assembly 102; a light directing assembly, generally at 104; and a detection assembly 106. The light source assembly 102 includes a laser, which in the present example is a Nd-YAG laser generating a laser pulse $L_1$ of 10 nsec duration at a wavelength of 1064 nm. The detection assembly 106 includes a detector (photomultiplier) 106A for collecting scattered and diffracted light from the periodic pattern produced on the sample to enable controlling the pattern parameters. The detection assembly also includes a detector 106B (photodiode) for controlling the parameters of laser radiation used for patterning the sample.

The light directing assembly 104 includes a beam splitter 107; and a prisms/mirrors' arrangement. The latter is appropriately designed and oriented to define three light propagation channels: the first processing channel for directing most of laser generated intensity $L_1$ towards the sample S for the purpose of patterning, the second channel for directing a part $L_2$ of the laser light $L_1$ towards the sample for illuminating the created periodic pattern and detecting scattered and diffracted light from the pattern to thereby enable monitoring the pattern parameters, and the third control channel for directing yet another part $L_3$ of this light to the laser control detector 106B. To this end, the prisms/mirror arrangement includes three such assemblies: The first assembly is formed by prisms 108 and 109 directing the laser light towards the beam splitter 107, and mirror 110 accommodated in the path of one of the split light components $L'_1$ and $L''_1$ to direct this light component $L'_1$ towards the sample. The arrangement is such that these two split light components $L'_1$ and $L''_1$, are directed to the sample with, respectively, $+\theta$ and $-\theta$ degrees with respect to the normal to the surface and interfere at the sample. The second assembly includes mirrors 112, 114 and 115 used to redirect the part $L_2$ (about 4%) of the laser light $L_1$ towards the sample along a different optical path, to thereby enable a real time optical second harmonic generation (SHG) detection of the pattern. The third assembly includes mirror 113 that directs the part $L_3$ (about 4%) of the light part $L_2$ to the photodiode 106B. Also preferably provided in the system 100 is a filter assembly 116 configured for controlling the intensity of the processing laser light $L_1$ propagating towards the sample for patterning it.

In the most general application, when patterns are made of wires 5 nm thick or more, a simple He—Ne laser (5 mW) can be used as the pattern recognition and monitoring device. An example of this application will be described further below with reference to FIGS. 3A and 3B.

The BLALP process is governed by heat conductivity and diffusivity within the substrate, as follows:

The temporal profile of the surface temperature (derived from the heat diffusion equation) is given by:

$$T(T_i, t) = T_i + (F_0 \cdot B/K_c) \cdot (K_d/\pi)^{-1/2} \int_0^\tau A(t-\tau) \cdot \tau^{1/2} \, d\tau$$

wherein $T_i$ is the initial crystal temperature; $F_0$ is the maximal absorbed laser power density (MW/cm2); $K_c$ is the heat conductivity; $K_d$ is the heat diffusivity; and $B=\exp(-\alpha z)$ is the decreasing laser intensity inside the bulk (z=0 at the surface), which vanishes in metals at z~15-30 nm.

Inserting the above expression for $T(T_i,t)$ into the rate of desorption $R_d$, we obtain:

$$R_d = -d\Theta/dt = \Theta^n \upsilon_d \exp[-E_d/kT(T_i,t)]$$

wherein $\upsilon_d$ is the preexponential factor; $E_d$ is the activation energy for desorption.

Figure 3A:
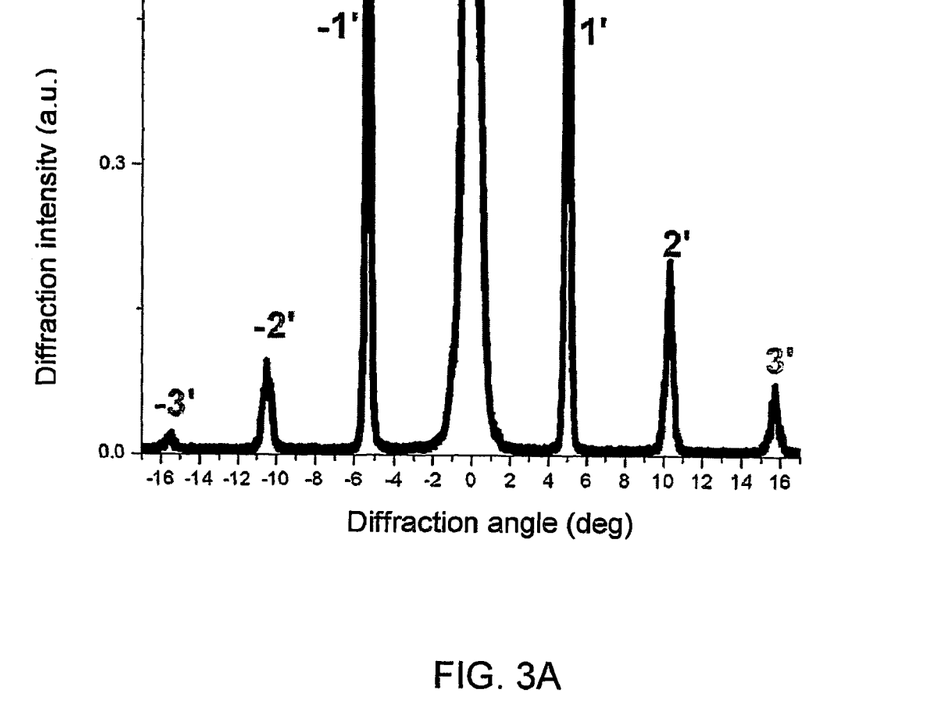
FIGS. 3A and 3B illustrate the optical diffraction obtained as a result of the patterning procedure by the BLALP process of the invention.
Figure 3B:
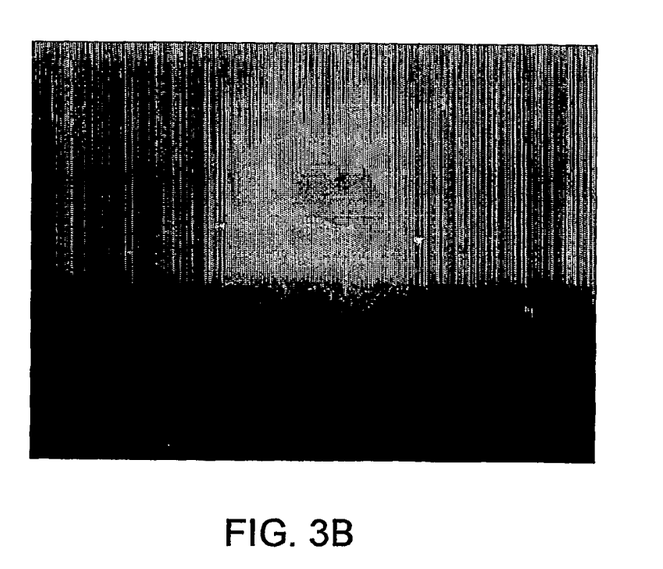
Figure 4A:
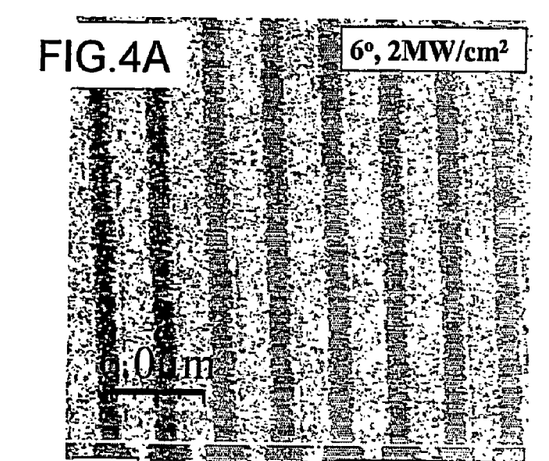
FIGS. 4A-4D illustrate the experimental results demonstrating the unique features of the BLALP technique of the present invention in determining the spacing between lines and their width.
Figure 4B:
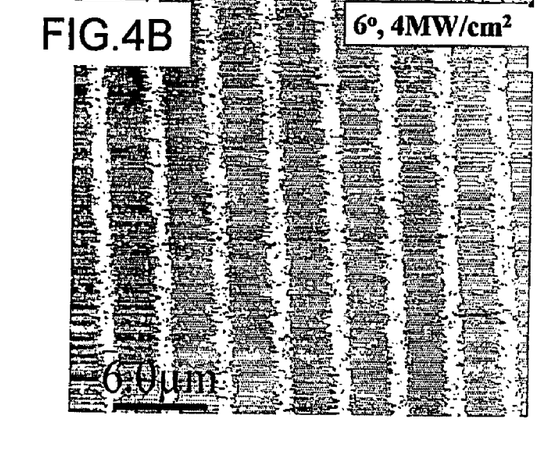
Figure 4C:
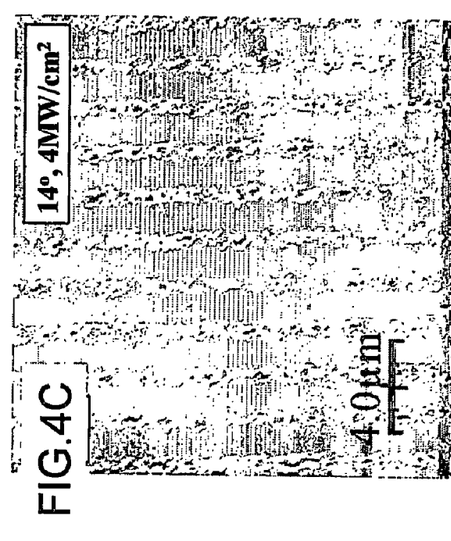
Figure 4D:
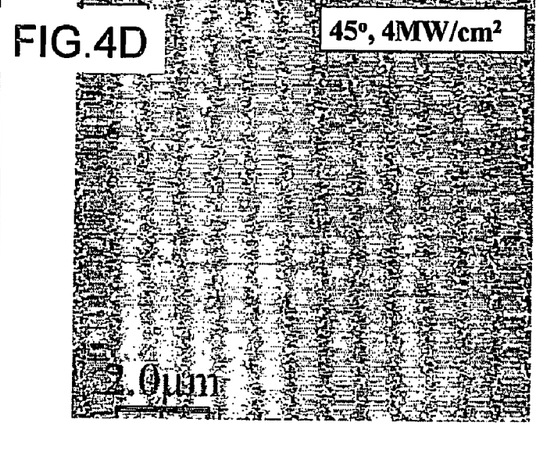

FIGS. 3A-3B illustrate the results of the patterning procedure by the BLALP process of the invention: FIG. 3A shows the intensity of light diffracted from the pattern (diffraction intensity) as a function of diffraction angle; and FIG. 3B shows an image of the He—Ne laser (linear) optical diffraction from the patterned metallic layer.

The higher order optical diffraction signals were found to provide extremely sensitive in-situ buffer layer thickness monitor. This is due to the exponential dependence of the intensity on the buffer layer thickness.

FIGS. 4A-4D illustrate the experimental results demonstrating the unique features of the BLALP technique of the present invention in determining the spacing between lines and their width. In these examples, the sample under patterning was prepared by depositing Xe as a buffer material on a metallic single crystal surface of Ru(001) under UHV conditions at 20K, and depositing a film of gold on top of the buffer layer. FIGS. 4A-4D show the gold lines ("wires") that are 5 mm long (the laser beam size) and width varying between 2-0.35 μm at different angles between two laser beams and at two laser powers.

In another specific example, potassium was used as the conductive material on top of Xe-buffer over Ru(001) at 20° K. under UHV conditions. Multilayer xenon desorbs from metallic surfaces in the temperature range of 45-70° K. (activation energy of 3.7±0.2 Kcal/mol on Ru(001) assuming a pre-exponent of $10^{13}$ sec$^{-1}$) [8]. Potassium is known as having a high optical second harmonic response, and its growth can therefore be in-situ monitored. The inventors have previously investigated Potassium on Re(001) and Ru(001), studying ad-atoms lateral interactions, second harmonic generation (SHG) response and diffusion [9, 10]. Potassium at low coverage is strongly bound to metallic substrates. Activation energy for desorption of 48 Kcal/mole was determined on Ru(001) at 0.3 ML, with a peak desorption near 650K [10]. The inventors have found that low coverage LITD-grating formation of potassium demonstrates the unique advantage of the buffer layer technique in substrate damage-free patterning of strongly bound metallic layers.

The Ru substrate was mounted on a cryogenic close cycle refrigerator (APD, minimum sample temperature 20° K.), in a chamber with a base pressure of 2-10$^{-10}$ mbar. Dosing of xenon and potassium was calibrated before and after each measurement by temperature programmed desorption (ΔP-TPD) and by recording optical second harmonic response during TPD (SH-TPD). A p-polarized, 10 nsec pulsed Nd:YAG laser at its fundamental wavelength of 1064 nm was used for the coverage grating formation via LITD and as the optical SHG probe. Periodic coverage modulations were created by overlapping two split beams of the same laser pulse on the sample surface, each at an incident angle of ±6° with respect to the surface normal. The resulting coverage grating had a period of 5 μm. The fraction of the Nd:YAG pulse used as the probe laser for SHG was at a power density of 0.1 MW/cm$^2$ homogeneous, non-focused beam at incident angle of 50° with respect to the normal to the surface. This power density prevents any desorption of Xe from the surface by the SHG probe laser beam. The peak temperature rise, due to the probe laser heating, was calculated to be 18K above the substrate temperature of 20K. This is based on the standard heat diffusivity models used in LITD applications [4, 5].

The second harmonic response from Potassium evaporated on top of a xenon layer has been recorded. There is an overall second harmonic intensity enhancement of about 30% by the xenon layer relative to the signal obtained from potassium on the bare Ru(001) surface. This second harmonic signal is independent of the Xe layer thickness. Maximum SHG intensity recorded is for potassium coverage near 1 ML, consistent with the behavior of potassium directly deposited on Ru(001) and other substrates [9-13].

Figure 5:
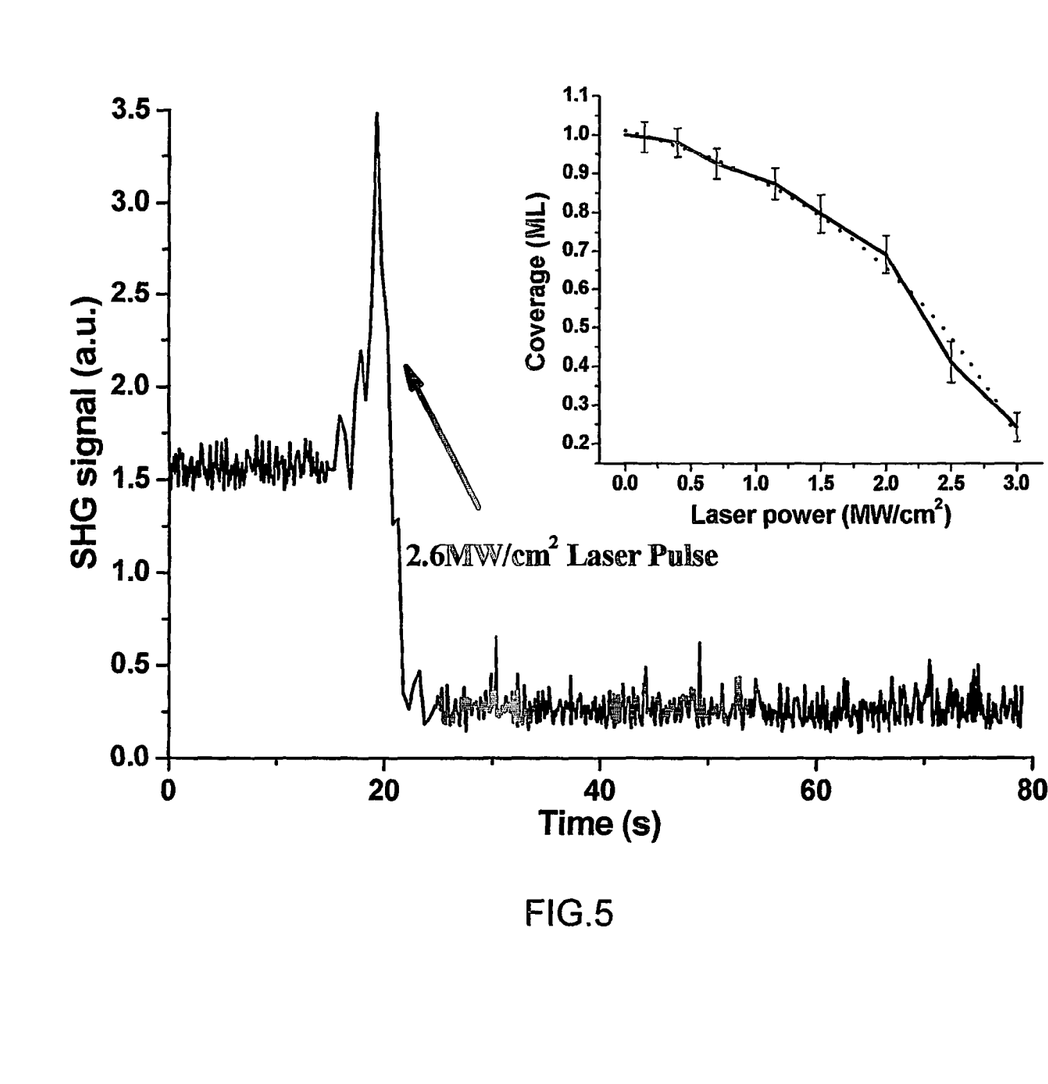
FIG. 5 exemplifies the SHG intensity from 1 ML potassium on Xe buffer layer, before, during and after a single laser-desorption pulse at power density of 2.6 $MW/cm^2$.

In order to examine the removal of potassium together with the xenon by the LITD process, experiments of a single laser pulse at power densities in the range 0.3-3.5 MW/cm$^2$ were conducted with a sample consisted of 1 ML K on top of 60 ML Xe. The potassium coverage remaining on top of the Xe layer following a single laser pulse that strikes the entire surface of the sample was monitored by running SH-TPD spectra. This is shown in FIG. 5 illustrating the SHG intensity from 1 ML potassium on Xe before, during and after a single laser-desorption pulse at power density of 2.6 MW/cm$^2$. The K coverage after the pulse, determined by calibrated SH-TPD, was 0.4 ML. Also shown in the figure (insert) is the Potassium coverage, remaining on the surface after a single laser pulse hits 1 ML K on 60 ML Xe, as a function of laser power density. The coverage is determined by the zero order SHG signal before and during SH-TPD. The dashed line represents an exponential fit. Integrated areas under such curves, when normalized to the signal at 1 ML, can be used to evaluate the remaining potassium coverage [11]. These measurements provide for selecting the optimal laser power densities for the potassium coverage grating formation.

These experimental results provide a clear confirmation of removal of the metallic film via the buffer layer at laser power densities well below those needed for desorbing the potassium layer directly attached to the substrate. For comparison, a minimum absorbed laser power density of 10 MW/cm$^2$ is necessary to obtain a rather shallow coverage grating of potassium on Ru(001) and Re(001) [11].

Potassium gratings were generated at absorbed laser power densities between 1-3.5 MW/cm$^2$ (the measured reflectivity of Ru(001) at 1.064 μm is 0.75). Monitoring high order SH-diffraction peaks from such coverage grating is the signature of its formation [1, 2]. The SH-diffraction spectra obtained from this range of LITD power densities lead to gradual widening of the ejected troughs as laser power increases. This results in changing the diffraction pattern by increasing the relative intensity of the first to zero order SHG diffraction peaks. At power densities above 3 MW/cm$^2$, the wider potassium desorbing stripes result in effective smoothening of the density modulation, thus strongly attenuating the zero and therefore also higher order SH diffracted signals. The optimal potassium grating formation (in terms of SH-diffraction order peak intensities) was obtained at absorbed laser power density of 2 MW/cm$^2$.

Figure 6:
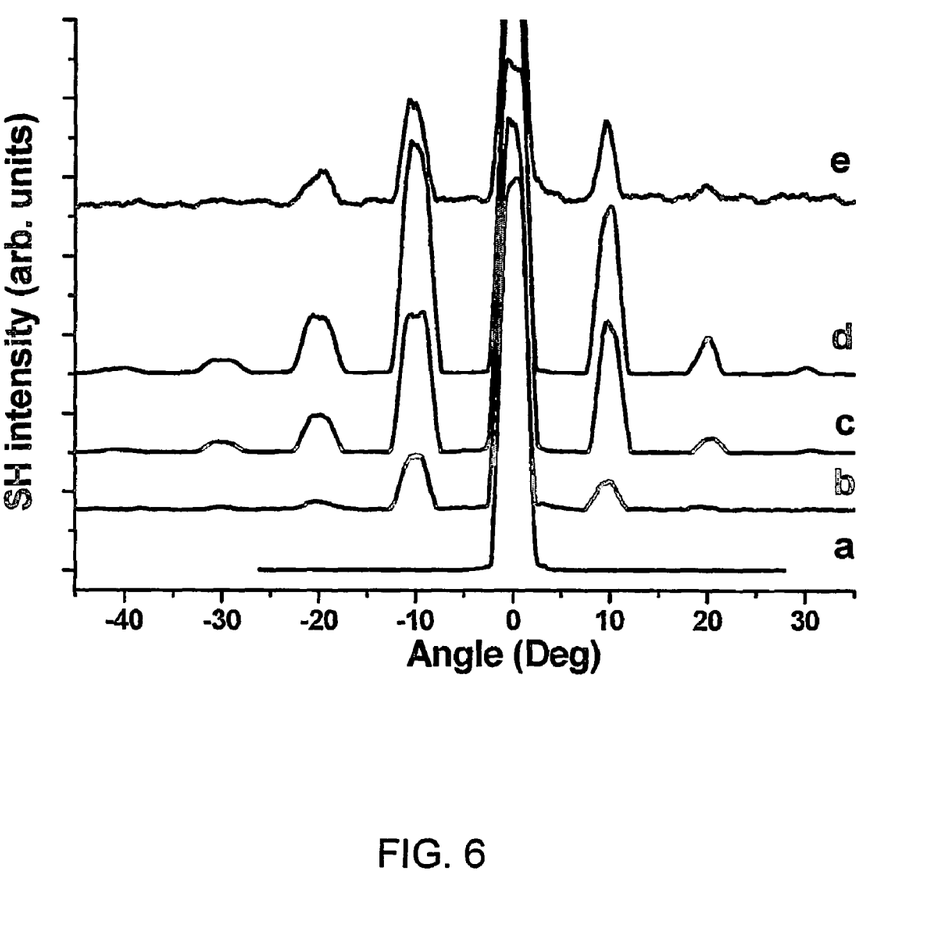
FIG. 6 exemplifies the SH diffraction intensities from potassium coverage grating on a Xe buffer layer, normalized to the zero order SH intensity at different thickness of K deposition after annealing the surface to 100K to evaporate the Xe.

FIG. 6 illustrates a SH diffraction spectra recorded from potassium gratings on a Xe buffer layer, normalized to the zero order SH intensity. Here, a diffraction spectrum a corresponds to the deposition of K on a previously prepared coverage grating of clean 1 ML Xe. Other diffraction spectra are due to potassium deposited on 20 ML Xe prior to LITD grating formation at 20 K, as described above. Laser power density of 2 MW/cm$^2$ was used throughout for the grating formation: graph b corresponds to 0.3 ML K; graph c—1 ML K; graph d—5 ML; graph e—1 ML K after annealing the surface to 100K to evaporate the Xe.

The diffraction peak intensities are stable, as long as the sample temperature is cold enough to avoid substantial multilayer xenon desorption, namely below 35K. Further shielding of the metallic patterns from background gases over several hours was obtained, by covering the potassium grating by another layer of xenon. Vacuum impurities, in particular CO, are known to form complexes with potassium, which result in significant quenching of the SHG signal and the corresponding diffraction peaks obtained from coverage grating [14]. The onset for grating formation at laser power densities described above requires a minimum xenon layer thickness of 2 ML. For all buffer layer thicknesses up to 60 ML, the zero order diffraction peak intensity, that reflects the total potassium coverage, is the same within 10%. In the xenon coverage range of 2-20 ML, increasing the buffer layer thickness tends to change the grating shape into a deeper profile, as deduced from Fourier analysis of the diffracted peak intensities.

In order to demonstrate the applicability of the patterning method of the present invention for strongly bound species, coverage gratings were generated at several initial potassium film thicknesses, from 0.3 ML to 5 ML, at a Xe buffer layer thickness of 20 ML. Forming of a grating of 0.3 ML potassium directly adsorbed on Ru(001) is impossible by employing laser power densities below the onset of surface damage (15 MW/cm$^2$). The strongly bound grating is demonstrated by the diffraction spectrum shown in FIG. 6, graph b for a potassium film of 0.3 ML. The 5 ML potassium example (graph d) thus demonstrates the potential practical application of the invented technique to form real conducting wires.

The inventors have also tested the process proposed by in reference [15], where a method based on laser-patterned xenon film as a template for hydrogen patterning on Si(111) was used. In that case, the species to be patterned were deposited over pre-patterned Xe layer. The test carried out by the inventors started from making a coverage grating within the clean Xe films, and only subsequently potassium was evaporated on top. It appeared that no diffraction spectrum can be obtained for any Xe thickness or laser power density: Only the zero order SHG signal that reflects the total potassium coverage can be detected, as shown in FIG. 6, graph a. This result is not surprising in view of the similar sticking of potassium (and most other metals) expected on both the Xe covered and the bare areas of the Ru(001) substrate, which lead to homogeneous, non-patterned potassium coverage.

The metallic adsorbate grating obtained with the technique of the present invention is stable and can be conserved after slowly desorbing the buffer layer at 80° K. This can be verified by the SH diffraction spectrum obtained following the annealing procedure, as shown in FIG. 6, graph e. The SH diffraction pattern resembles that obtained from potassium grating on top of the xenon layer (FIG. 6, graph c). It might be concluded that slow desorption of the physisorbed buffer layer does not significantly modify the metallic adsorbate grating profile, and that the potassium grating was kept intact upon slow xenon removal. However, the overall intensity of the SH diffraction peaks is reduced while the intensity ratios between the zero, first and second order diffraction peaks are the same as those obtained with potassium grating on top of the Xe buffer layer. This can be explained by the BLAG mechanism [6, 7]. Desorption of the xenon buffer layer near 50K (multilayer) leads to an abrupt drop of the zero order SHG signal. Gradual migration of potassium atoms or small clusters towards the ruthenium surface as the Xe atoms are desorbing, is associated with nucleation and growth of the metallic layer as large particles or clusters. This aggregation process results in reducing the surface area of the potassium, therefore leading to the abrupt decrease of the SH signal. By further heating the sample, SHG regain its intensity to the typical SH response obtained from clean ~0.9 ML potassium on the Ru(001) surface [11]. This might result from clusters wetting, therefore recovering the original surface area of potassium on top of the Ru(001) surface.

Figure 7:
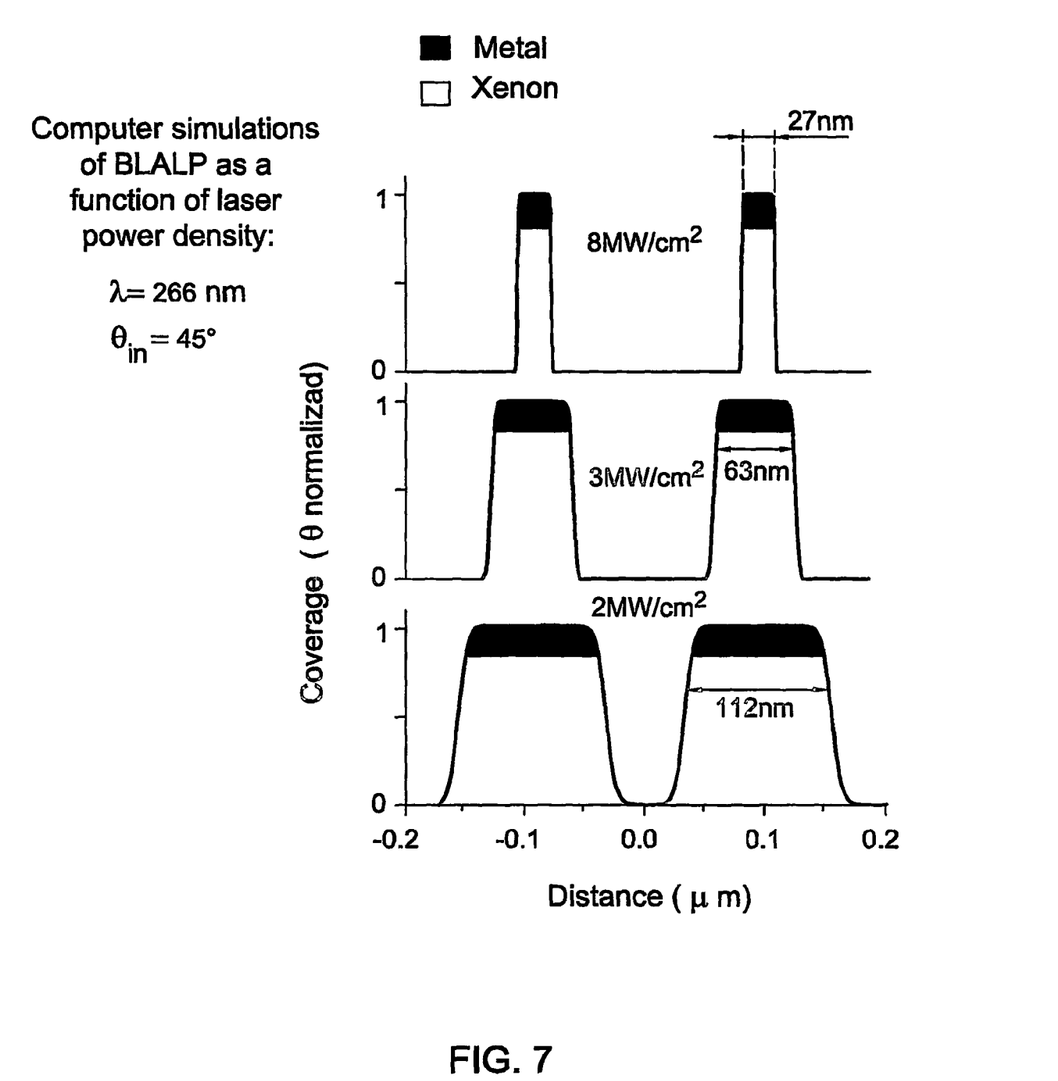
FIG. 7 illustrates the simulated LYTD grating patterns of metallic stripes on top of Xe buffer layers before annealing.
Figure 8A:
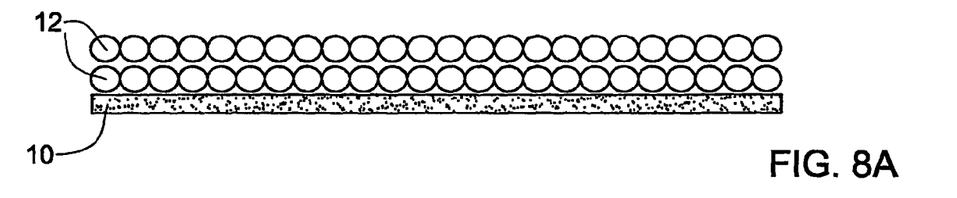
FIGS. 8A-8D schematically illustrate the main steps of BLALP procedure according to another embodiment of the present invention, the so-called "negative" BLALP.
Figure 8B:
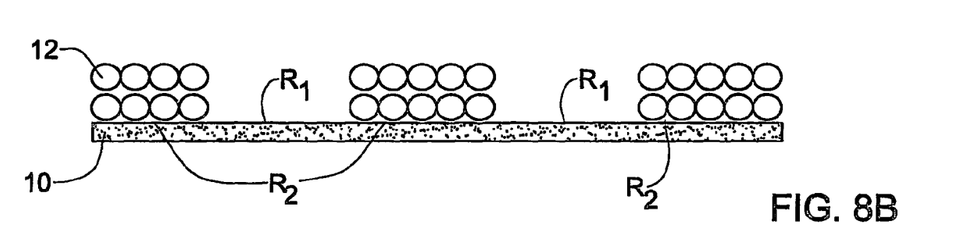
Figure 8C:
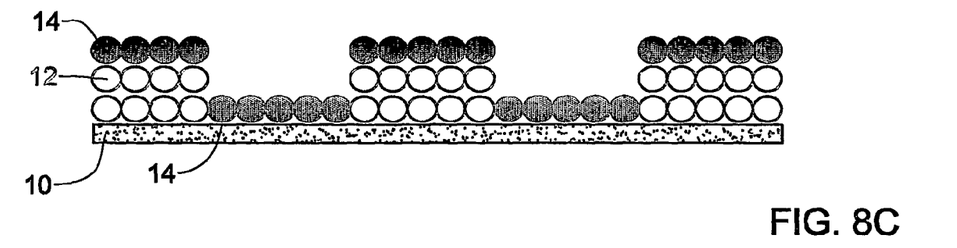
Figure 8D:
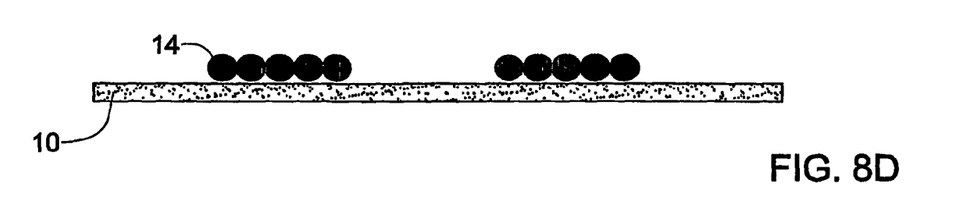

The BLALP technique of the present invention is capable of providing parallel "writing" of conducting lines down to widths of 30 nm. FIG. 7 illustrates simulation results of using this technique for obtaining grating patterns of the conducting stripes on top of Xe buffer layer, showing the metallic stripes coverage before annealing as a function of laser power density for the above laser parameters ($\lambda$=266 nm and angle of incidence of 45 degrees). The simulations are based on standard LITD process [4, 5, 8] using desorption kinetic parameters of Xe on Ru(001), as discussed above.

The present invention thus provides for spatial patterning of metallic (or any other strongly interacting species) adsorbates on surfaces utilizing physisorbed buffer layer assisted laser patterning technique. Low laser power densities, required for the grating formation, prevent any surface damage. This technique can advantageously be used for the deposition of periodic and more complex spatial patterns of conducting wires at widths well below the current limits. The technique of the present invention utilizes a clean UHV based procedure, and is thus faster and more efficient than wet photo-lithographical techniques that currently dominate in the microelectronics industry. Based on the Bragg law, a grating period is given by $\omega=\lambda/2\text{-}\sin(\theta)$, therefore by varying the LITD wavelength to the UV range (e.g., 4$^{th}$ harmonic of a Nd:YAG laser at 266 nm) and angle of incidence to 45 degrees, a pattern with a 0.19 μm period can be obtained. Increasing the laser power density, conducting wires at widths that are 20-25% of the grating period can be obtained. Consequently, using the technique of the present invention, conducting wires can potentially be patterned at widths of less than 30 nm, employing the "positive" BLALP procedure.

In the above-described examples, "positive" BLALP was used. The inventors have also shown the effective operation of "negative" BLALP. The main steps of this embodiment are illustrated in FIGS. 8A-8D: Initially, structure formed by a buffer material layer on top of a substrate is provided. Then, a pattern is created on the clean buffer layer at low temperature. A metal film is subsequently deposited on top of the patterned buffer layer. Then, a second uniform laser pulse is used to ablate the remaining buffer layer material with the metal on top. In this way, smooth and uniform lines are left on the substrate where the metallic element has directly been deposited on the substrate. In this way, narrower widths than those obtained via the "positive" BLALP can be formed, as the laser power diminishes. Furthermore, this technique provides for further protecting the substrate from laser damage.

Figure 9:
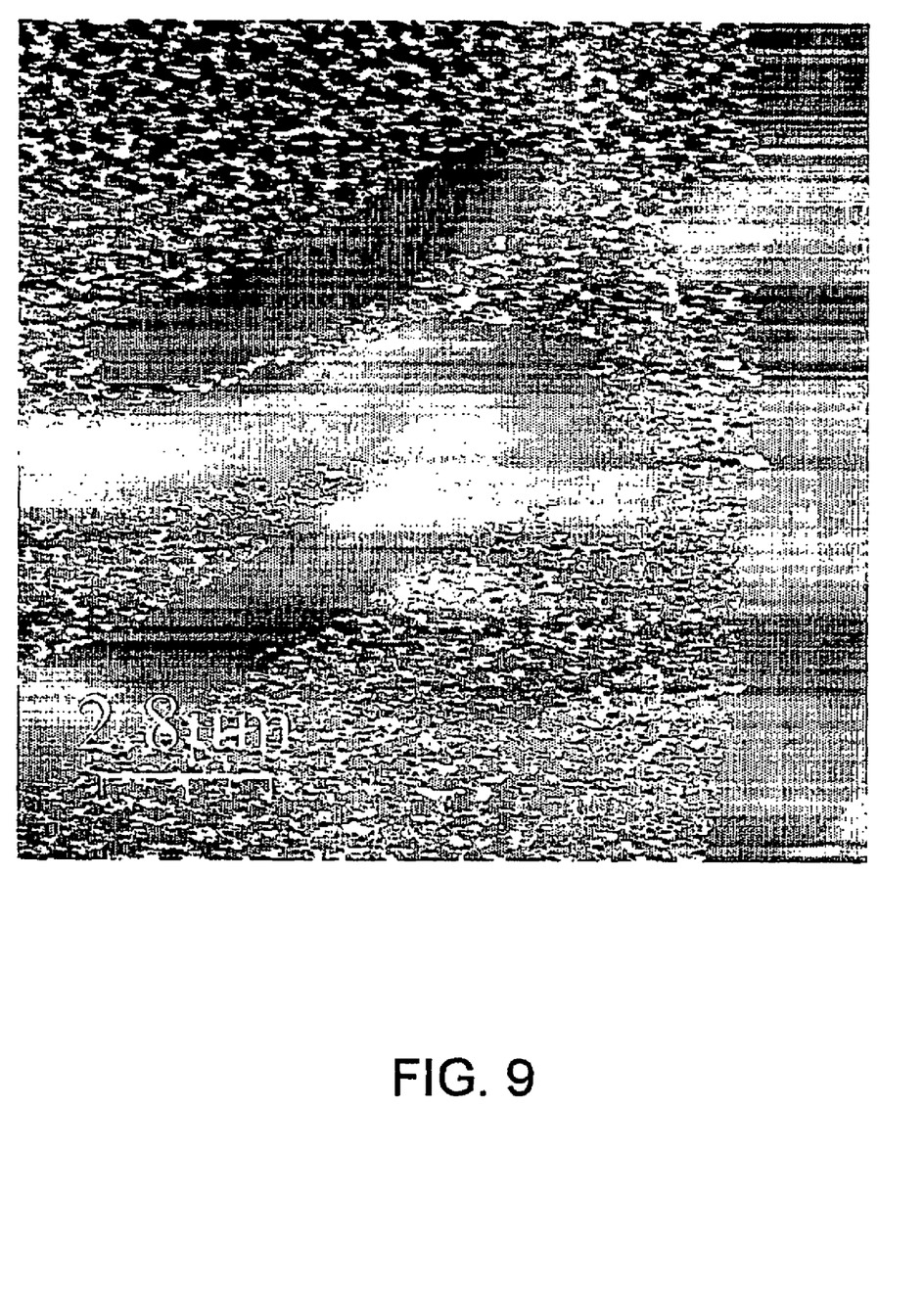
FIG. 9 exemplifies a patterned structure formed by the BLALP procedure according to yet another embodiment of the invention, using a mask typically employed in standard photo-lithography.

The inventors have also shown that BLALP can be implemented using a mask, as in standard photo-lithography, and a single uniform (not split) laser beam. This enables generation of complex features and complicated patterns by employing the BLALP technique. The unique advantage of BLALP over standard lithography is the possibility of varying the laser power in order to control the line widths. FIG. 9 illustrates a patterned structure formed by the BLALP via a mask. Extremely sharp border lines appear between deposited and ablated areas. The edges are estimated at width of less than 50 nm.

Those skilled in the art that modifications and changes can be applied to the embodiments of the invention as hereinbefore exemplified without departing from its scope defined in and by the appended claims.

The invention claimed is:

1. A method for forming a micro- or nano-pattern of a certain material on a substrate, the method comprising.
   (i) utilizing pulsed laser irradiation to create a patterned physisorbed buffer layer on top of a substrate, said pattern being in the form of buffer regions including the physisorbed buffer layer with said certain material on top thereof and arranged with spaces between the buffer regions; and
   (ii) applying a thermal process to remove from said patterned layer at least the buffer material from said buffer regions, and thus form a pattern of spaced-apart regions of said certain material on the substrate.

2. The method of claim 1, carried out in vacuum conditions at cryogenic temperatures.

3. The method of claim 1, wherein the pattern of said material is formed using a positive lithography.

4. The method of claim 3, comprising:
   depositing the buffer layer on the substrate, and depositing a film of said material onto the buffer layer, thereby obtaining a layered structure on the substrate; processing the layered structure by applying a pulsed laser radiation to remove the buffer layer and said material layer from the substrate in the spaced-apart regions of the substrate defined by the pattern to be formed;
   applying said thermal process consisting of thermal annealing to thereby remove the remaining buffer layer between the patterned material and the substrate, and subsequently allowing said material to gradually migrate to the substrate surface within said regions, thereby forming said stable pattern of said material on the substrate.

5. The method of claim 4, wherein the thermal annealing is carried out at room temperature.

6. The method of claim 1, wherein the pattern of said material is formed using a negative lithography.

7. The method of claim 6, comprising:
   depositing the buffer layer on the substrate; removing the buffer layer within the spaced-apart regions of the substrate using a pulsed laser irradiation; depositing said certain material to cover the buffer layer and the substrate surface within the spaces between said buffer regions;
   applying said thermal process consisting of a pulsed laser irradiation to remove the remaining buffer layer with said material on top thereof, thereby forming said stable pattern of said material on the substrate.

8. The method of claim 4, wherein said processing of the layers structure comprises irradiating the structure with the laser irradiation of a predetermined wavelength range to form a certain interference pattern on said structure corresponding to the pattern to be obtained.

9. The method of claim 8, wherein said irradiating is carried out by a single laser pulse.

10. The method of claim 9, wherein said single laser pulse is split into two beams which recombine on the layered structure thereby providing said interference pattern.

11. The method of claim 8, wherein an angle of incidence of said radiation is varied to define a pitch of the periodic pattern.

12. The method of claim 1, wherein the thermal process comprises irradiating the substrate with laser radiation of a predetermined wavelength range to form a certain interference pattern on said structure corresponding to the pattern to be obtained.

13. The method of claim 12, wherein said irradiating is carried out by a single laser pulse.

14. The method of claim 13, wherein said single laser pulse is split into two beams which recombine on the layered structure thereby providing said interference pattern.

15. The method of claim 12, wherein an angle of incidence of said radiation is varied to define a pitch of the pattern.

16. The method of claim 1, wherein the thermal process is carried out by applying a single pulse of a uniform laser beam via a mask designed in accordance with the pattern to be formed.

17. The method of claim 1, wherein said substrate is selected from semiconductor, an oxide thereof or metal.

18. The method of claim 1, wherein said buffer layer is selected from noble gases, hydrocarbons, $CO_2$, water and $N_2O$.

19. The method of claim 1, wherein said material to be patterned is a metal-based material, or a semiconductor-based material, or a material based on an oxide.

20. The method of claim 19, wherein said metal is selected from alkali metals, copper, silver or gold.

21. The method of claim 1, wherein a material of the buffer layer is adsorbable to the substrate more weakly than said certain material.

22. A method for forming a micro- or nano-pattern of a certain material on a substrate, the method comprising.
   depositing a buffer layer on the substrate, and depositing a film of said certain material onto the buffer layer, thereby obtaining a layered structure on the substrate;
   processing the layered structure by applying a pulsed laser radiation to remove the buffer layer and said material layer from the substrate in spaced-apart regions of the substrate defined by the pattern to be formed;
   applying annealing process to remove the buffer layer between the substrate and said certain material within said regions, and subsequently allowing said certain material to gradually migrate to the substrate surface within said regions, thereby forming a pattern of said certain material on the substrate.

23. A method for forming a micro- or nano-pattern of a certain material on a substrate, the method comprising.
   depositing a buffer layer on a substrate;
   utilizing pulsed laser irradiation to create a pattern on top of the substrate in the form of spaced-apart regions of the buffer layer;

depositing said certain material to cover the buffer layer and the substrate surface within the spaces between said buffer regions, thus forming a pattern of the spaced-apart regions each including the buffer layer with said certain material on top thereof;

applying a thermal process to remove the buffer layer and said certain material from said regions, and thus form a pattern of said material on the substrate, said thermal process comprising laser ablation.

\* \* \* \* \*